(12) United States Patent
Ngo et al.

(10) Patent No.: US 6,261,952 B1
(45) Date of Patent: Jul. 17, 2001

(54) METHOD OF FORMING COPPER INTERCONNECTS WITH REDUCED IN-LINE DIFFUSION

(75) Inventors: Minh Van Ngo, Fremont; Fei Wang, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/411,245

(22) Filed: Oct. 4, 1999

(51) Int. Cl.[7] .................... H01L 21/44; H01L 21/4763; H01L 21/461
(52) U.S. Cl. .................... 438/687; 438/625; 438/627; 438/629; 438/637; 438/723; 438/745; 438/756
(58) Field of Search .................... 438/625–629, 438/637–640, 652–654, 687, 723, 743, 745, 756

(56) References Cited

U.S. PATENT DOCUMENTS

| | | | |
|---|---|---|---|
| 5,442,828 | * 8/1995 | Lutz | 15/88.3 |
| 5,447,887 | 9/1995 | Filipiak et al. | 438/644 |
| 5,693,563 | 12/1997 | Teong | 438/627 |
| 6,090,701 | * 7/2000 | Hasunuma et al. | 438/632 |

* cited by examiner

Primary Examiner—John F. Niebling
Assistant Examiner—Ha Tran Nguyen

(57) ABSTRACT

Cu diffusion between Cu and Cu alloy interconnect members, e.g., lines, is avoided or substantially reduced by selectively removing an upper portion of the inter-layer dielectric between neighboring lines to form a recess and depositing a diffusion barrier layer filling the recess between neighboring lines. Embodiments include filling damascene trenches in a silicon oxide inter-layer dielectric with Cu or a Cu alloy, CMP to effect planarization such that the upper surfaces of the lines are substantially coplanar with the upper surface of the inter-layer dielectric, and double-sided brush scrubbing with water. The planarized surface is then etched, as by treatment with a HF solution, to selectively remove silicon oxide between neighboring lines to form a recess therebetween. The exposed surfaces of the neighboring lines are then treated with an ammonia plasma to remove or substantially reduce oxides and a silicon nitride diffusion barrier layer is deposited on the neighboring lines filling the recesses between neighboring lines.

17 Claims, 2 Drawing Sheets

METHOD OF FORMING COPPER INTERCONNECTS WITH REDUCED IN-LINE DIFFUSION

RELATED APPLICATIONS

Patent Applications: Ser. No. 09/411,243 filed on Oct. 4, 1999; Ser. No. 09/477,820 filed on Jan. 5, 2000, now U.S. Pat. No. 6,146,988 issued Nov. 14,2000; and Ser. No. 09/447,719 filed on Jan. 5, 2000.

TECHNICAL FIELD

The present invention relates to a semiconductor device comprising copper (Cu) and/or Cu alloy interconnect patterns. The present invention is applicable to manufacturing high speed integrated circuits having submicron design features and reliable Cu and/or Cu alloy interconnect patterns with reduced in-line Cu diffusion.

BACKGROUND ART

The escalating requirements for high density and performance associated with ultra large scale integration semiconductor wiring require responsive changes in interconnection technology. Such escalating requirements have been found difficult to satisfy in terms of providing a low RC (resistance capacitance) interconnection pattern, particularly wherein submicron vias, contacts and trenches have high aspect ratios due to miniaturization.

Conventional semiconductor devices typically comprise a semiconductor substrate, such as undoped monocrystalline silicon, and a plurality of sequentially formed inter-layer dielectrics and patterned metal layers. An integrated circuit is formed containing a plurality of conductive patterns comprising conductive lines separated by interwiring spacings, and a plurality of interconnecting lines, such as bus lines, bit lines, word lines and logic interconnecting lines. Typically, the conductive patterns on different layers, i.e., upper and lower layers, are electrically connected by a conductive plug filling a via opening, while a conductive plug filling a contact opening establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometries shrink into the deep submicron range.

A conductive plug filling a via opening is typically formed by depositing an inter-layer dielectric on a patterned conductive (metal) layer comprising at least one metal feature, forming an opening in the inter-layer dielectric by conventional photolithographic and etching techniques, and filling the opening with a conductive material, such as tungsten (W). Excess conductive material on the surface of the inter-layer dielectric is removed by chemical-mechanical polishing (CMP). One such method is known as damascene and basically involves the formation of an opening which is filled in with a metal. Dual damascene techniques involve the formation of an opening comprising a lower contact or via opening section in communication with an upper trench opening section, which opening is filled with a conductive material, typically a metal, to simultaneously form a conductive plug in electrical contact with a conductive line.

High performance microprocessor applications require rapid speed of semiconductor circuitry.

The speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and cross-sectional areas and distances between interconnects decrease, the RC delay caused by the interconnect wiring increases. If the interconnection node is routed over a considerable distance, e.g., hundreds of microns or more, as in submicron technologies, the interconnection capacitance limits the circuit node capacitance loading and, hence, the circuit speed. As design rules are reduced to about 0.18 micron and below, e.g., about 0.15 micron and below, the rejection rate due to integrated circuit speed delays severely limits production throughput and significantly increases manufacturing costs. Moreover, as line widths decrease, electrical conductivity and electromigration resistance become increasingly important.

Cu and Cu alloys have received considerable attention as a replacement material for aluminum (Al) in interconnect metallizations. Cu is relatively inexpensive, has a lower resistivity than Al, and has improved electrical properties vis-à-vis W. Accordingly, Cu is a desirable metal for use as a conductive plug as well as wiring.

Electroless plating, and electroplating of Cu and Cu alloys offer the prospect of low cost, high throughput, high quality plated films and efficient via, contact and trench filling capabilities.

Electroless plating, generally involves the controlled autocatalytic deposition of a continuous film on the catalytic surface by the interaction in solution of a metal salt and a chemical reducing agent. Electroplating comprises the electrodeposition of an adherent metallic coating on a electrode employing externally supplied electrons to reduce metal ions in the plating solution. A seed layer is required to catalyze electroless deposition or to carry electrical current for electroplating. For electroplating, the seed layer must be continuous. For electroless plating, very thin catalytic layers, e.g., less than 100 Å, can be employed in the form of islets of catalytic metal.

An approach to forming Cu plugs and wiring comprises the use of damascene structures employing CMP, as in Teong, U.S. Pat. No. 5,693,563. However, due to Cu diffusion through the dielectric interlayer, Cu interconnect structures must be encapsulated by a diffusion barrier layer.

Typical diffusion barrier materials include tantalum (Ta), tantalum nitride (TaN), titanium (Ti), titanium nitride (TiN), titanium-tungsten (TiW), titanium-titanium nitride (Ti-TiN), tungsten (W), tungsten nitride (WN), and silicon nitride for encapsulating Cu. The use of such barrier materials to encapsulate Cu is not limited to the interface between Cu and the dielectric interlayer, but includes interfaces with other metals as well.

Additional problems attendant upon conventional Cu interconnect methodology stem from poor adhesion of a capping layer on the exposed planarized Cu or Cu alloy surfaces. Consequently, the capping layer is vulnerable to removal, as by peeling due to scratching or stresses resulting from subsequent deposition of layers. As a result, Cu or the Cu alloy is not entirely encapsulated and Cu diffusion occurs, thereby adversely affecting device performance and decreasing the electromigration resistance of the Cu or Cu alloy interconnect member. In U.S. Pat. No. 5,447,887, the adhesion problem of a silicon nitride capping layer to a Cu interconnect is addressed by initially treating the exposed surface with silane in the absence of a plasma to form a thin layer of copper silicide, and depositing a silicon nitride capping layer thereon.

As design rules are scaled down into the deep submicron range, e.g., about 0.18 microns and under, the reliability of encapsulated Cu and/or Cu alloy interconnect members becomes increasingly significant. It was found that conventional practices in forming a Cu and/or Cu alloy interconnect member in a damascene opening results in the formation of a thin copper oxide surface film, believed to comprise a mixture of CuO and $Cu_2O$. It is believed that such a thin copper oxide surface layer forms during CMP. The thin copper oxide surface film layer is porous and brittle in nature. The presence of such a thin copper oxide surface film undesirably reduces the adhesion of a capping layer, such as silicon nitride to the underlying Cu and/or Cu alloy interconnect member. Consequently, cracks are generated at the Cu or Cu alloy/copper oxide interface, thereby resulting in copper diffusion and increased electromigration as a result of such diffusion. The cracks occurring in the Cu or Cu alloy/copper oxide interface enhance surface diffusion, which is more rapid than grain boundary diffusion or lattice diffusion. The silane treatment disclosed in U.S. Pat. No. 5,447,887, issued to Filipiak et al., generates a thin copper silicide layer on the underlying Cu interconnect member which improves adhesion of a silicon nitride capping layer thereto, but does not address or solve the diminution in adhesion attributable to the presence of the thin copper oxide surface film, which adversely affects adhesion of the capping layer thereon. In copending U.S. patent applications: Ser. No. 09/112,158 filed on Jul. 9, 1998; Ser. No. 09/112,472 filed on Jul. 9, 1998; and Ser. No. 09/112,161 filed on Jul. 9, 1998, techniques are disclosed for removing the oxide layer formed on a Cu or Cu alloy line formed as a result of CMP prior to depositing the capping layer with an attendant improvement in the adhesion of the capping layer to the Cu metalization.

There are, however, further problems attendant upon Cu metallization, particularly when reducing the spacing between Cu or Cu alloy interconnect members, such as lines, to a distance of about 0.10 to about 0.50 micron, e.g., about 0.25 to about 0.50 micron. It was found that as the Cu or Cu alloy lines are formed closer and closer together, in-line diffusion of Cu occurs between neighboring Cu and/or Cu lines which results in shorting therebetween.

Accordingly, there exists a need for a semiconductor device having submicron features and a Cu or Cu alloy interconnect pattern with reduced Cu diffusion between interconnect features. There also exists a need for cost effective, efficient methodology for manufacturing a semiconductor device having submicron features and a Cu or Cu alloy interconnect pattern comprising closely spaced apart neighboring lines with reduced in-line Cu diffusion.

DISCLOSURE OF THE INVENTION

An advantage of the present invention is a semiconductor device having submicron features and a Cu or Cu alloy interconnect pattern with reduced Cu diffusion between interconnect features.

Another advantage of the present invention is a method of manufacturing a semiconductor device having submicron features and a Cu or Cu alloy interconnect pattern with reduced in-line Cu diffusion.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming an inter-layer dielectric having an upper surface and overlying a substrate; forming a plurality of spaced apart openings in the inter-layer dielectric; filling the openings with copper (Cu) or a Cu alloy to form a pattern comprising neighboring spaced apart interconnect members each having an upper surface; planarizing such that the upper surface of neighboring interconnect members is substantially coplanar with the upper surface of the inter-layer dielectric; selectively removing a portion of the inter-layer dielectric between neighboring interconnect members forming a recess therebetween, such that the upper surface of the neighboring interconnect members extends higher, with respect to the substrate, than the upper surface of the inter-layer dielectric between the neighboring interconnect members; and depositing a diffusion barrier layer on the upper surface of the inter-layer dielectric and on the upper surface of the neighboring interconnect members filling the recess.

Embodiments of the present invention include forming a damascene pattern comprising a plurality of neighboring Cu or Cu alloy interconnect lines in a silicon oxide inter-layer dielectric, CMP, double-sided brush scrubbing with water and etching, as with a solution of hydrofluoric acid(HF), to selectively remove an upper portion of the silicon oxide dielectric between the neighboring interconnect lines to form a recess therebetween. The surfaces of the Cu and/or Cu alloy pattern are then treated with an ammonia plasma to remove any surface oxides formed during CMP. The diffusion barrier layer, e.g., a capping layer such as silicon nitride, is then deposited on the Cu and/or Cu alloy lines and filling the recesses between neighboring lines.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF DRAWINGS

In FIGS. 2–5, similar features are denoted by similar reference numerals.

DESCRIPTION OF THE INVENTION

The present invention addresses and solves problems attendant upon forming a Cu and/or Cu alloy interconnect pattern, e.g., an interconnect pattern comprising a plurality of neighboring Cu and/or Cu alloy lines, which problems stem from Cu diffusion between the lines, thereby causing short circuiting. Such problems are particular acute in semiconductor devices comprising interconnect patterns having submicron features and minimal interwiring spacings, as where the Cu and/or Cu alloy lines are separated by a distance of about 0.10 to about 0.50 micron, e.g., about 0.25 micron to about 0.50 micron. As employed throughout this application, the symbol Cu is intended to encompass high purity elemental copper as well as Cu-based alloys, such as Cu alloys containing minor amounts of tin, zinc, maganese, titanium, magnesium and germanium. As also employed throughout this application, the term "neighboring" is intended to denote two features or lines separated by dielectric material.

Figure 1:
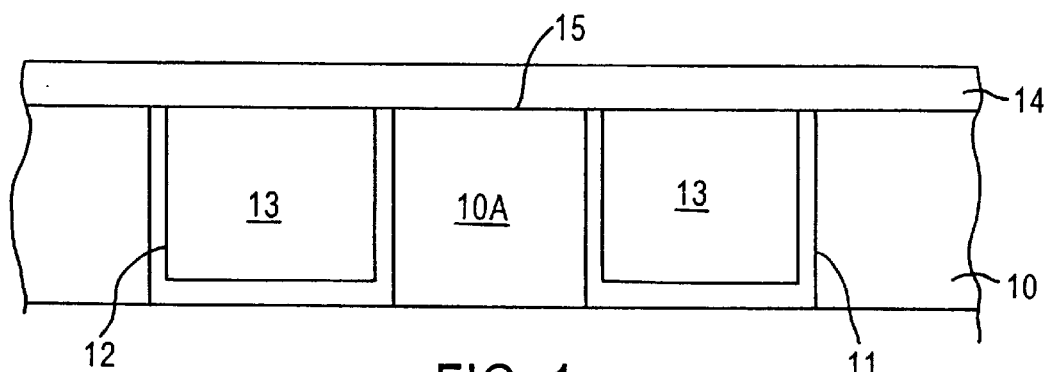
FIG. 1 schematically illustrates a conventional Cu interconnect structure.
Figure 2:
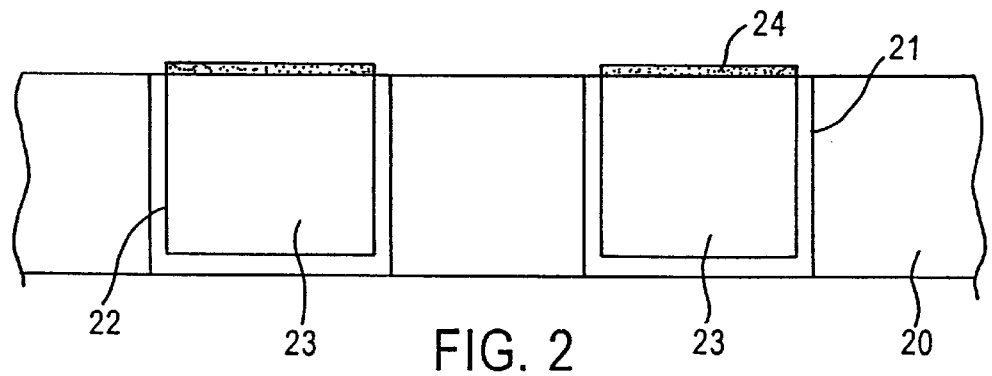
FIGS. 2–5 schematically illustrate sequential phases of a method in accordance with an embodiment of the present invention.

A conventional interconnect structure is schematically illustrated in FIG. 1 and comprises interlayer dielectric 10 in which a plurality of openings 11 are formed. A barrier layer 12, such as TaN, is deposited lining openings 11. A Cu layer is then deposited on inter-layer dielectric 10 filling openings 11, followed sequentially by conventional planarization as by CMP and double-sided brush scrubbing, as with water, e.g., de-ionized water. A diffusion barrier or capping layer 14, e.g., silicon nitride, is then deposited. It was found that as the spacing between Cu lines 13 decreases, e.g., below about 0.50 micron, Cu diffusion between lines 13 occurs notwithstanding the presence of barrier metal layer 12 lining trenches 11. It is believed that such in-line Cu diffusion occurs along the upper surface 15 of the portion of the inter-layer dielectric 10A between the neighboring Cu lines 13.

In accordance with an embodiment of the present invention, the diffusion pathway in the upper portion of the dielectric material separating neighboring Cu features, e.g., Cu lines, is blocked with a material impeding Cu diffusion, i.e., a diffusion barrier material. Embodiments of the present invention comprise selectively removing a portion of the dielectric material between neighboring features or lines, as by etching, e.g., with an aqueous HF solution, to form a recess therebetween and filling the recess with a diffusion barrier material, such as silicon nitride, and when depositing a silicon nitride capping layer.

Embodiments of the present invention further include removing or substantially reducing the oxide layer generated on the upper surfaces of the Cu features or lines as a result of CMP by treatment with an ammonia plasma and then depositing the capping layer, e.g., silicon nitride layer, on the treated surfaces and filling the recesses between the neighboring Cu lines. In this way, the diffusion pathway in the upper surface of the inter-layer dielectric between neighboring Cu lines is blocked by a diffusion barrier material, e.g., silicon nitride, and the silicon nitride capping layer is tightly adhered to the in-laid Cu metallization.

Embodiments of the present invention include etching to selectively remove the upper portion of the inter-layer dielectric, e.g., silicon oxide, between neighboring Cu lines, as with an acid, e.g., HF, which is selective with respect to the silicon oxide between the Cu lines. For example, the recesses can be formed by etching with a solution of de-ionized water and HF at a water: HF volume ratio of about 100:1. Given the present disclosure and objective, the optimum depth of the recess can be determined for a particular situation. For example, it was found that a suitable recess depth of about 30 Å to about 200 Å, when filled with a diffusion barrier material, such as silicon nitride, effectively achieves the objective of the present invention by preventing in-line Cu diffusion. The recess can also be formed by anisotropic etching, as with plasma or reactive ion etching.

An embodiment of the present invention is schematically in FIGS. 2–5. Adverting to FIG. 2, an inter-layer dielectric 20 is formed above a substrate (not shown) and a plurality of openings 21 are formed in inter-layer dielectric 20 by a conventional damascene technique. Such damascene openings can include trenches which are subsequently filled to form lines. A Cu layer is then deposited in a conventional manner on inter-layer dielectric 20, filling the openings. Conventional planarization s then conducted, as by CMP, followed by double-sided brush scrubbing with water, e.g., de-ionized water, to form Cu lines 23 having a thin copper oxide film 24 thereon. Upon electroplating or electroless plating the Cu layer, a seedlayer (not shown) is deposited on barrier layer 22.

Figure 3:
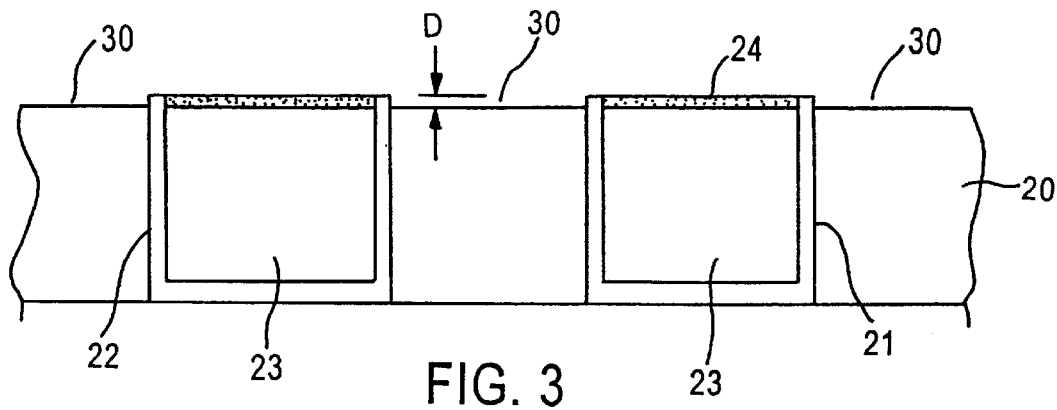
Figure 4:
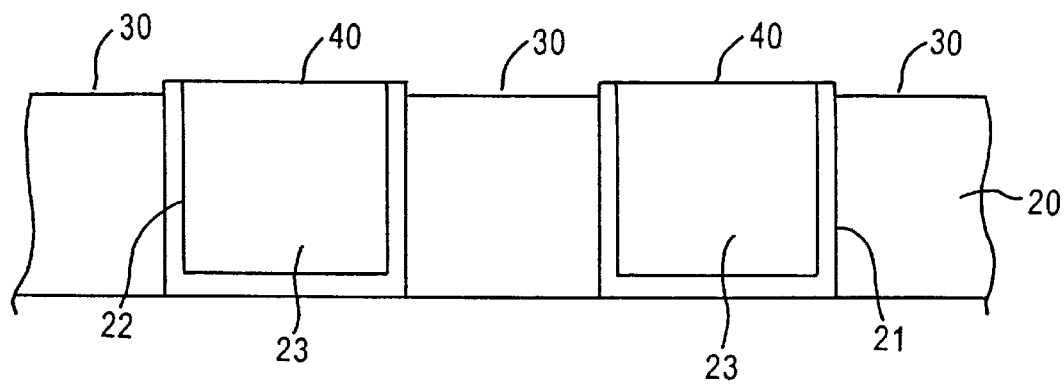

Adverting to FIG. 3, acid etching, as with an aqueous solution of HF, is then conducted to selectively remove the upper portion of the inter-layer dielectric 20 between neighboring Cu lines 23 to form recesses 30. The recesses 30 typically have a depth from the upper surface of the neighboring Cu lines 23 to the upper surface of the inter-layer dielectric 20, indicated by reference numeral D in FIG. 3, of about 30 Å to about 200 Å. Adverting to FIG. 4, the surface of the interconnect pattern is then treated with an ammonia plasma to remove or substantially reduce the surface oxide 24 (FIG. 3) formed on the Cu lines 23, leaving a clean exposed surface 40.

Figure 5:
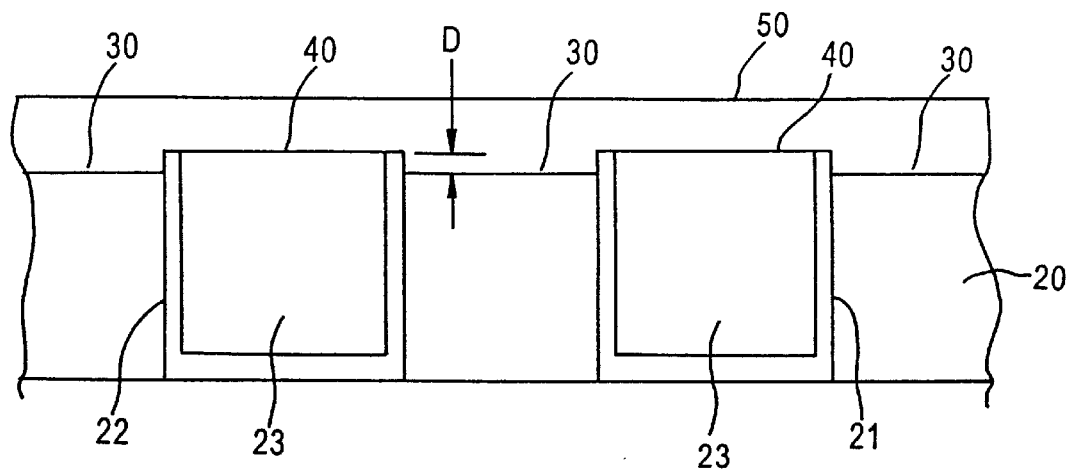

A diffusion barrier or capping layer 50, such as silicon nitride, is then deposited in a conventional manner, as by plasma enhanced chemical vapor deposition, as shown in FIG. 5. Silicon nitride capping layer 50 covers the upper surfaces 40 of the Cu lines 23 tightly adhering thereto by virtue of removing the surface oxide layer 24 (FIG. 3). In addition, silicon nitride capping layer 50 fills in the recesses 30 between neighboring Cu lines 23, thereby providing an effective barrier against inline Cu diffusion between the neighboring Cu lines 23. Thus, in accordance with the present invention, in-line Cu diffusion between closely spaced apart Cu lines is prevented, thereby preventing shorting and, hence, improving the overall reliability and lifetime of the resulting semiconductor device.

Given the present disclosure and the objectives of the present invention, the conditions during plasma treatment with ammonia can be optimized in a particular situation. For example, the exposed oxidized surfaces of the Cu features can be treated with an ammonia plasma at an ammonia flow rate of about 500 to about 3,000 sccm, a pressure of about 1.9 to about 2.5 Torr, a temperature of about 250° C. to about 350° C., and an RF power of about 300 to about 700 watts, for about 1 second to about 20 seconds. Advantageously, treatment of the Cu interconnect in an ammonia-containing plasma and deposition of the capping layer, e.g., silicon nitride, are conducted in the same CVD apparatus or tool.

Cu interconnect patterns formed in accordance with embodiments of the present invention can be, but are not limited to, interconnects formed by damascene technology. Thus, embodiments of the present invention include forming an inter-layer dielectric overlying a substrate forming openings, e.g., damascene openings, in the inter-layer dielectric, depositing a diffusion barrier layer, such as TaN, and filling the openings with Cu. Advantageously, the openings in the inter-layer dielectric can be filled by initially depositing a seed layer and then electroplating or electroless plating the Cu layer. CMP is then performed such that the upper surface of the Cu lines is substantially coplanar with the upper surface of the inter-layer dielectric, followed by double-sided brush scrubbing with de-ionized water. As a result, a thin film of copper oxide is typically formed. In accordance with embodiments of the present invention, recesses are selectively formed between neighboring Cu lines and the exposed oxidized surface of the Cu lines are treated with an ammonia-containing plasma to remove or substantially reduce the thin copper oxide film, thereby presenting a clean surface. A capping layer, such as silicon nitride, is then deposited in accordance with conventional methodology filling the recess, thereby preventing in-line Cu diffusion. In accordance with other embodiments of the present invention, the damascene openings are filled with Cu by physical vapor deposition at a temperature of about 50° C. to about 150° C., or by CVD at a temperature of about 200° C.

In the various embodiments of the present invention, conventional substrates and inter-layer dielectrics, barrier layers and capping layers can be employed. For example, the substrate can be doped monocrystalline silicon or gallium-arsenide. The inter-layer dielectric employed in the present invention can comprise any dielectric material conventionally employed in the manufacture of semiconductor devices. For example, dielectric materials such as silicon dioxide, phospho-silicate glass (PSG), boron doped PSG (BPSG), and silicon dioxide derived from tetraethylorthosilicate (TEOS) or silane by PECVD can be employed. The openings formed in the inter-layer dielectric are effected by conventional photolithographic and etching techniques. Inter-layer dielectrics in accordance with the present invention can also comprise low dielectric constant materials, including polymers, such as polyamides. The conditions under which a capping layer, such as silicon nitride, is formed are conventional and, hence, not elaborated upon herein.

The present invention is applicable to the manufacture of various types of semiconductor devices comprising metallization interconnect patterns. The present invention is particularly applicable in manufacturing semiconductor devices having a design rule less than about 0.18 micron, e.g., less than about 0.15 micron, with interconnect patterns comprising Cu lines spaced apart by a distance of less than about 0.5 micron.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, the method comprising:
   forming an inter-layer dielectric, comprising a dielectric material having an upper surface and overlying a substrate;
   forming a plurality of spaced apart openings in the inter-layer dielectric;
   filling the openings with a copper (Cu) or Cu alloy to form a pattern comprising neighboring spaced apart interconnect members each having an upper surface;
   planarizing such that the upper surface of neighboring interconnect members is substantially coplanar with the upper surface of the inter-layer dielectric;
   selectively removing a portion of the dielectric material leaving a remaining portion of the dielectric material of the inter-layer dielectric between neighboring interconnect members forming a recess therebetween, such that the upper surface of the neighboring interconnect members extends higher, with respect to the substrate, than the upper surface of the inter-layer dielectric comprising the remaining portion of dielectric material between the neighboring interconnect members; and
   depositing a diffusion barrier layer on the upper surface of the inter-layer dielectric and on the upper surface of the neighboring interconnect members filling the recess.

2. The method according to claim 1, comprising depositing a layer comprising silicon oxide to form the inter-layer dielectric.

3. The method according to claim 2, comprising depositing a layer comprising silicon nitride to form the diffusion barrier layer.

4. The method according to claim 3, comprising etching to selectively remove a portion of the inter-layer dielectric between the neighboring interconnect members to form the recess.

5. The method according to claim 3, comprising etching with a solution of hydrofluoric acid(HF).

6. The method according to claim 5, comprising etching with an aqueous solution comprising de-ionized water and HF at a water:HF volume ratio of about 100:1.

7. The method according to claim 3, further comprising depositing a barrier metal lining the openings before filling the openings with Cu or a Cu alloy.

8. The method according to claim 7, comprising forming trenches as the openings and filling the trenches with Cu or a Cu alloy to form lines.

9. The method according to claim 3, comprising forming neighboring interconnect members spaced apart by a distance of about 0.10 micron to about 0.5 microns.

10. The method according to claim 8, comprising forming the recess with a depth, from the upper surface of the neighboring interconnect members to the upper surface of the inter-layer dielectric between the neighboring interconnect members, of about 30 Å to about 200 Å.

11. The method according to claim 8, further comprising:
    chemical mechanical polishing the Cu or Cu alloy layer to effect the planarizing leaving the upper surfaces of the interconnect members oxidized;
    forming the recess;
    treating the interconnect members with an ammonia plasma, after forming the recess, to remove or substantially reduce the oxidized surfaces; and
    subsequently depositing the silicon nitride diffusion barrier layer.

12. The method according to claim 11, comprising treating the oxidized upper surfaces of the interconnect members with an ammonia plasma at:
    an ammonia flow rate of about 500 to about 3,000 sccm;
    a pressure of about 1.9 to about 2.5 Torr.;
    a temperature of about 250° C. to about 350° C.; and
    an RF power of about 300 to about 700 watts.

13. The method according to claim 11, comprising double-sided brush scrubbing with water after chemical mechanical polishing to effect the planarizing and before forming the recess.

14. The method according to claim 4, comprising etching with an acid to form the recess.

15. The method according to claim 4, comprising anisotropically etching to form the recess.

16. A method of manufacturing a semiconductor device, the method comprising:
    forming an inter-layer dielectric having an upper surface and overlying a substrate;
    forming a plurality of spaced apart openings in the inter-dielectric layer;
    filling the openings with a copper (Cu) or a Cu alloy to form a pattern comprising neighboring spaced apart interconnect members each having an upper surface;
    planarizing such that the upper surface of neighboring interconnect members is substantially coplanar with the upper surface of the inter-dielectric layer;
    etching with a solution of hydrofluoric acid (HF) to selectively remove the portion of the inter-dielectric layer between neighboring interconnect members forming a recess therebetween, such that the upper surface of the neighboring interconnect members extends higher, with respect to the substrate, than the upper surface of the interlayer dielectric between the neighboring interconnect members; and
    depositing a diffusion barrier layer on the upper surface of the inter-layer dielectric and on the upper surface of the neighboring interconnect members filling the recess.

17. The method according to claim 16, comprising with an aqueous solution comprising deionized water and HF at a water:HF volume ratio of about 100:1.

* * * * *